(12) United States Patent
Rajavi et al.

(10) Patent No.: US 9,077,445 B2
(45) Date of Patent: Jul. 7, 2015

(54) TEMPERATURE COMPENSATED RF PEAK DETECTOR

(71) Applicant: QUALCOMM Incorporated, San Diego, CA (US)

(72) Inventors: Yashar Rajavi, San Jose, CA (US); Shahram Abdollahi-Alibeik, Los Gatos, CA (US)

(73) Assignee: Qualcomm Incorporated, San Diego, CA (US)

( * ) Notice: Subject to any disclaimer, the term of this patent is extended or adjusted under 35 U.S.C. 154(b) by 76 days.

(21) Appl. No.: 13/939,076

(22) Filed: Jul. 10, 2013

(65) Prior Publication Data
US 2015/0017922 A1  Jan. 15, 2015

(51) Int. Cl.
| H04B 1/38 | (2006.01) |
| H04B 17/00 | (2015.01) |
| H04B 17/10 | (2015.01) |
| H04B 17/11 | (2015.01) |
| H04B 17/16 | (2015.01) |
| H04B 17/318 | (2015.01) |
| H04B 17/345 | (2015.01) |
| G01R 21/01 | (2006.01) |

(52) U.S. Cl.
CPC ............. *H04B 17/00* (2013.01); *H04B 17/104* (2015.01); *H04B 17/11* (2015.01); *H04B 17/16* (2015.01); *H04B 17/318* (2015.01); *H04B 17/345* (2015.01); *G01R 21/01* (2013.01)

(58) Field of Classification Search
CPC ........ H03F 1/52; H03F 3/195; H03F 3/45475
USPC ................. 455/39, 1, 73, 91, 130, 501, 63.1, 455/115.1, 114.2, 226.1, 296, 278.2, 522, 455/127.1
See application file for complete search history.

(56) References Cited

U.S. PATENT DOCUMENTS

| 4,401,898 A | 8/1983 | Sommerer |
| 6,489,812 B1 | 12/2002 | Savard et al. |
| 7,064,585 B2 | 6/2006 | Glass |
| 7,643,805 B2 | 1/2010 | Tan et al. |
| 7,920,033 B1 | 4/2011 | Groe et al. |
| 2010/0321096 A1 | 12/2010 | Sudjian |
| 2012/0329418 A1* | 12/2012 | Chang et al. .................. 455/296 |

FOREIGN PATENT DOCUMENTS

WO 02103375 A2 12/2002

OTHER PUBLICATIONS

International Search Report and Written Opinion for International Application No. PCT/US2014/044243, ISA/EPO, Date of Mailing Sep. 2, 2014, 13 pages.

* cited by examiner

*Primary Examiner* — Tuan Pham
(74) *Attorney, Agent, or Firm* — Toler Law Group, PC

(57) ABSTRACT

A temperature compensated RF peak detector is disclosed. In an exemplary embodiment, an apparatus includes a first RF peak detector configured to generate a reference signal, a temperature compensated threshold generator configured to generate a temperature compensated detection threshold based on the reference signal, and a comparator configured to generate a peak detection output based on the temperature compensated detection threshold.

20 Claims, 4 Drawing Sheets

TEMPERATURE COMPENSATED RF PEAK DETECTOR

BACKGROUND

1. Field

The present application relates generally to the operation and design of analog front ends, and more particularly, to the operation and design of peak detectors for use in analog front ends.

2. Background

Radio frequency (RF) peak detectors can be used in a variety of applications. For example, an RF peak detector can be used to detect the RF transmit power output from a transmitter or to detect the presence of jammer signal power in a received RF signal.

One limitation associated with conventional RF peak detectors is that the gain of the detector may vary over temperature. This will directly translate to uncertainty in the sensitivity level of the detection. A typical solution to compensate for gain variations is to increase current in the peak detector as the temperature rises. Unfortunately, this technique may reduce the available headroom.

Therefore, it would be desirable to have an RF peak detector that overcomes the problems associate with conventional RF peak detectors.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
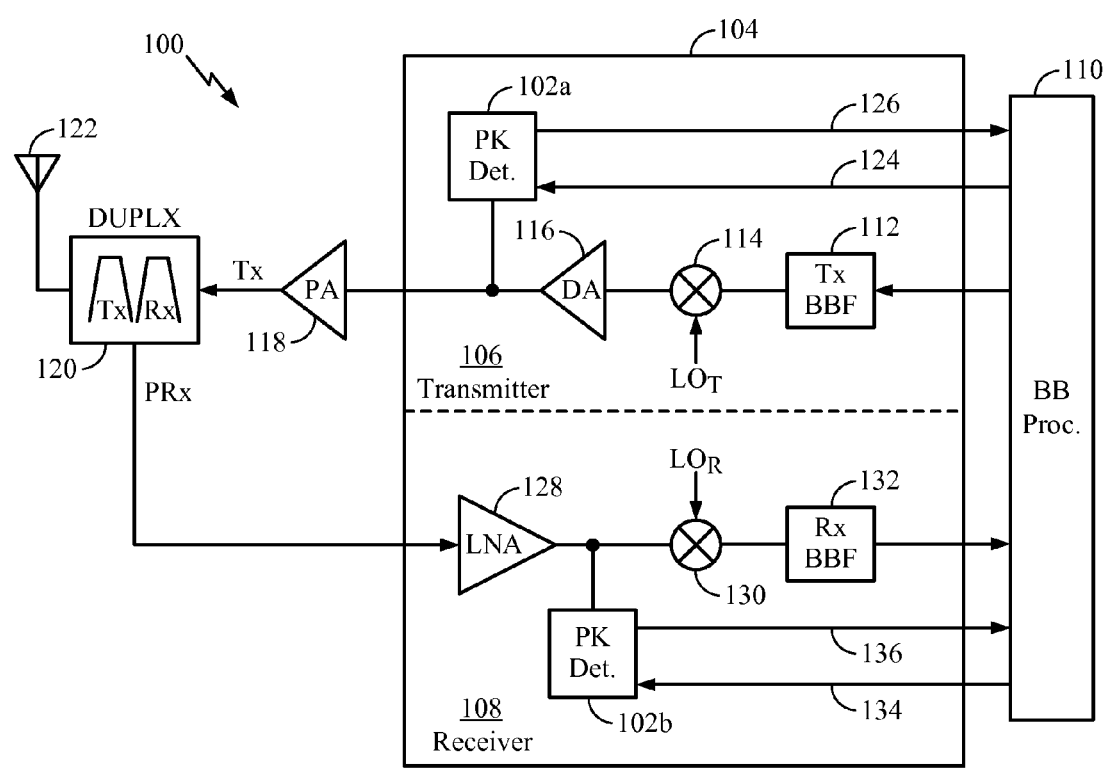
FIG. 1 shows a transmitter front end that comprises an exemplary embodiment of a temperature compensated RF peak detector suitable for use in a wireless device.

FIG. 1 shows a transmitter front end 100 that comprises an exemplary embodiment of a temperature compensated RF peak detector 102 suitable for use in a wireless device. The front end 100 comprises a transceiver 104 that includes a transmitter (Tx) portion 106 and a receiver (Rx) portion 108. Referring now to the transmitter portion 106, a baseband (BB) processor 110 outputs a BB transmit signal to a Tx BB filter 112. The output of the Tx BB filter 112 is input to an upconverter 114 that up-converts the baseband transmit signal to an RF transmit signal based on a local oscillator ($LO_T$) signal. The RF transmit signal is then input to a driver amplifier (DA) 116 that amplifies the transmit RF signal. The amplified RF transmit signal is input to a power amplifier (PA) 118 that further amplifies the transmit RF signal to form a Tx signal. The Tx signal that is output from the PA 118 is input to a duplexer 120 that directs the Tx signal to an antenna 122 for transmission.

The transmitter portion 106 includes an exemplary embodiment of a temperature compensated RF peak detector 102a. For example, the peak detector 102a provides accurate peak detection over a wide temperature range. The peak detector 102a receives controls signals 124 from the BB processor 110 which control the operation of the peak detector 102a, for example, to set an offset voltage and/or to set a temperature compensated detection threshold. A detection output 126 that is output from the peak detector 102a is input to the BB processor 110. For example, the peak detector 102a may operate as a transmit power detector and the detection output 126 of the peak detector 102a may be used by the BB processor 110 to adjust the transmit power of the Tx signal and/or to adjust other functions of the transceiver 104 in response to the detected power.

Referring now to the receiver portion 108, the duplexer 120 receives an RF signal and directs this signal to a low noise amplifier (LNA) 128. The amplified received RF signal that is output from the LNA 128 is input to a down-convertor 130 that down-converts the signal to baseband based on an LO signal ($LO_R$). The baseband signal is filtered by the Rx BB filter 132 and the filtered baseband signal is input to the (BB) processor 110.

The receiver portion 108 includes an exemplary embodiment of a temperature compensated RF peak detector 102b. For example, the peak detector 102b provides accurate peak detection over a wide temperature range. The peak detector 102b receives controls signals 134 from the BB processor 110 which control the operation of the peak detector 102b, for example, to set a voltage offset and/or a temperature compensated detection threshold. The detection output 136 of the peak detector 102b is input to the BB processor 110. For example, the peak detector 102b may operate as a jammer detector to detect the presence of jammer signal energy in the received RF signal. The BB processor 110 may operate to adjust the LNA 128 and/or other functions of the transceiver 104 in response to any detected jammers.

Thus, in various exemplary embodiments, a temperature compensated RF peak detector 102 operates in both a transmitter and a receiver to provide accurate RF peak detection functionality. In various exemplary embodiments, the RF peak detector 102 can be utilized to provide RF peak detection on any RF signal path. A more detail description of the temperature compensated RF peak detector 102 is provided below.

Figure 2A:
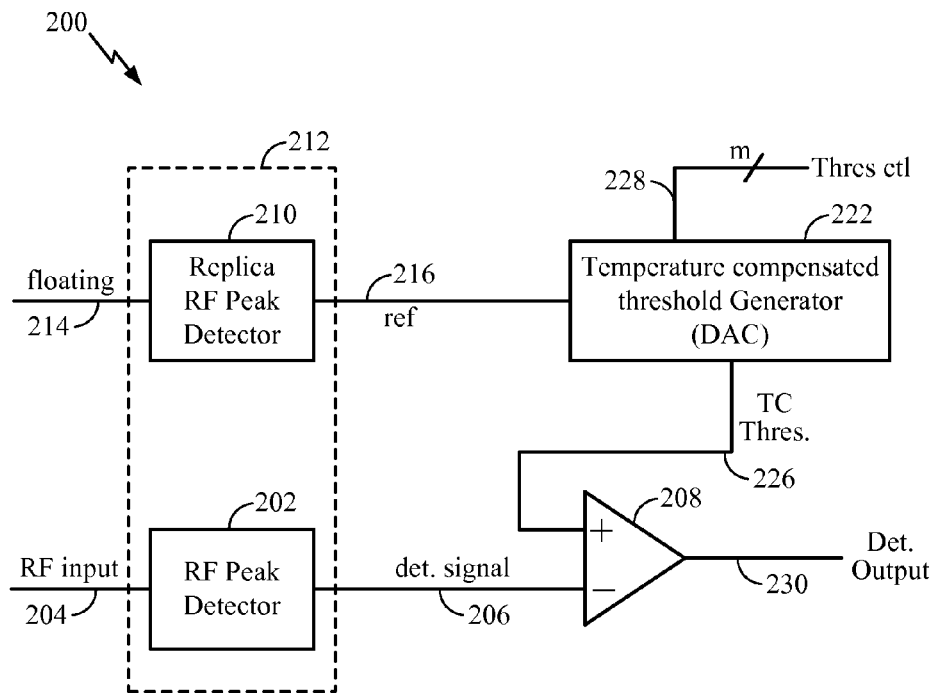
FIG. 2a shows a detailed exemplary embodiment of a temperature compensated RF peak detector.

FIG. 2a shows a detailed exemplary embodiment of a temperature compensated RF peak detector 200. For example, the peak detector 200 is suitable for use as the peak detector 102 shown in FIG. 1.

In an exemplary embodiment, the temperature compensated RF peak detector 200 comprises an RF peak detector 202 that receives RF signals 204 and generates a detection signal 206. The detection signal 206 is input to a comparator 208. For example, during operation the RF peak detector 202 outputs a voltage drop on the detection signal 206 in response to the amplitude of the input RF signals 204. The larger the amplitude of the RF input signals 204, the larger the voltage drop on the detection signal 206. The peak detector 202 also may be temperature sensitive so that the amplitude of the detection signal 206 moves up or down to reflect changes in temperature.

In an exemplary embodiment, a replica RF peak detector 210 is formed on the same integrated circuit 212 as the RF peak detector 202 and therefore exhibits approximately equal process variations (PVT) as the RF peak detector 202. The input 214 of the replica peak detector 210 is floating and therefore not connected to any time-varying signal. In other exemplary embodiments, the input 214 is connected to ground or other non time-varying signal so that there is no RF signal at the input 214. A reference signal 216 is generated by the replica RF peak detector 210 that is input to a temperature compensated threshold generator 222.

In an exemplary embodiment, the temperature compensated threshold generator 222 is configured with a DAC and generates a temperature compensated threshold voltage 226 based on the reference signal 216 and a digital threshold control signal 228 having m control bits In an exemplary embodiment, the threshold generator 222 comprises a proportional to absolute temperature (PTAT) current source and a resistor ladder network that is controlled by the digital threshold control signal 228 to generate the temperature compensated threshold voltage 226. Accordingly, the amplitude of the threshold control signal 228 tracks the amplitude of the detection signal 206 with respect to temperature. The temperature compensated threshold voltage 226 is also input to the comparator 208. In an exemplary embodiment, the temperature compensated threshold generator 222 receives the threshold control signal 228 from a baseband processor or other entity at the wireless device.

In an exemplary embodiment, the comparator 208 generates a detection output signal 230 based on a comparison of the detection signal 206 and the temperature compensated threshold voltage 226. For example the detection output signal 230 can be utilized by a baseband processor at the wireless device to detect jammer signals in a received RF signal or to detect transmit power of a transmit RF signal as discussed with reference to FIG. 1.

Accordingly, in various exemplary embodiments, the temperature dependence of the gain of the RF peak detector 202 is reduced or eliminated. The replica peak detector 210 is used to generate the reference signal 216, which acts as a point of comparison and has substantially equal process variations as the peak detector 202. The reference signal 216 is shifted using the threshold generator (DAC) 222 to generate a temperature compensated threshold 226. The amount of voltage shift determines the RF amplitude at which to trigger the peak detector.

Figure 2B:
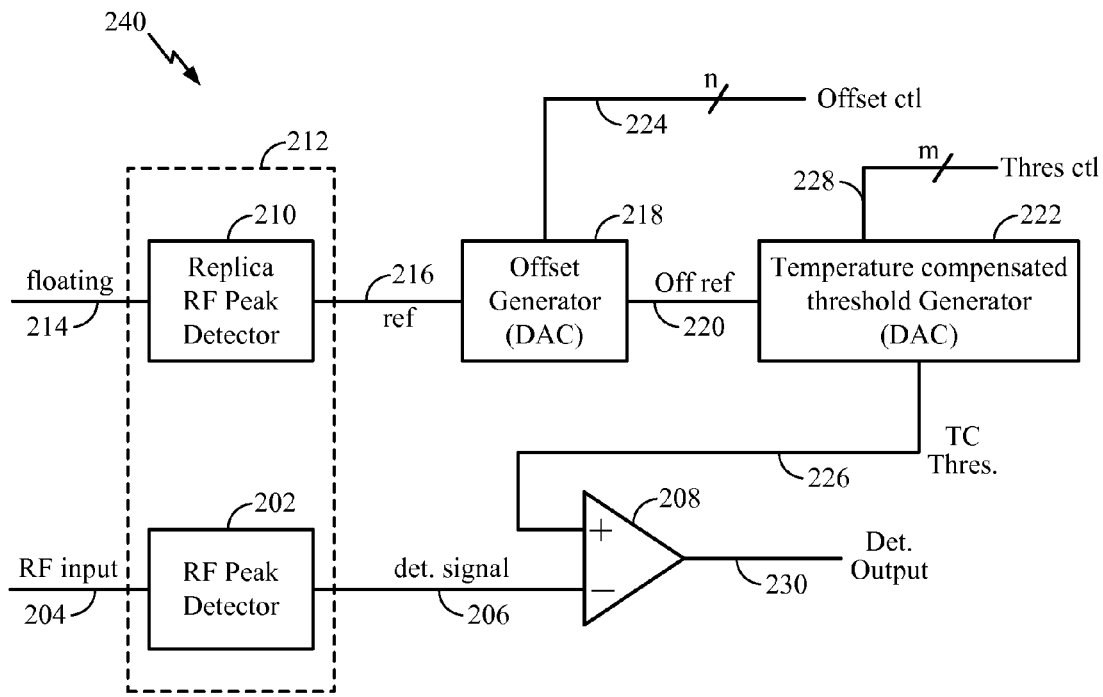
FIG. 2b shows an alternate detailed exemplary embodiment of a temperature compensated RF peak detector.

FIG. 2b shows an alternative detailed exemplary embodiment of a temperature compensated RF peak detector 240. For example, the peak detector 240 shown in FIG. 2b is suitable for use as the peak detector 102 shown in FIG. 1.

In an exemplary embodiment, the temperature compensated RF peak detector 240 comprises an offset generator 218 that operates to adjust a DC offset of the reference signal 216 to generate an offset adjusted reference signal 220 that is input to a temperature compensated threshold generator 222.

For example, the offset generator 218 is configured with a digital-to-analog convertor (DAC) and adjusts the offset of the reference signal 216 based on a digital offset control signal 224 that comprises a plurality of n control bits. The offset control bits 224 are set so that the offset adjusted reference signal 220 has the same offset as the detection signal 206 when no RF input signal is present at the input 204 of the RF peak detector 202. In an exemplary embodiment, the offset generator 218 receives the offset control signal 224 from a baseband processor or other entity at the wireless device.

In an exemplary embodiment, the temperature compensated threshold generator 222 is configured with a DAC and generates a temperature compensated threshold voltage 226 based on the offset adjusted reference signal 220 and a digital threshold control signal 228 having m control bits In an exemplary embodiment, the threshold generator 222 comprises a proportional to absolute temperature (PTAT) current source and a resistor ladder network that is controlled by the digital threshold control signal 228 to generate the temperature compensated threshold voltage 226. Accordingly, the amplitude of the threshold control signal 228 tracks the amplitude of the detection signal 206 with respect to temperature and offset. The temperature compensated threshold voltage 226 is also input to the comparator 208. In an exemplary embodiment, the temperature compensated threshold generator 222 receives the threshold control signal 228 from a baseband processor or other entity at the wireless device.

It should also be noted that in other exemplary embodiments, the offset generator 218 and the temperature compensated threshold generator 222 can be rearranged or reordered to generate the temperature compensated threshold signal 226.

Accordingly, in various exemplary embodiments, the temperature dependence of the gain of the RF peak detector 202 is reduced or eliminated. The replica peak detector 210 is used to generate the reference signal 216, which acts as a point of comparison and has substantially equal process variations as the peak detector 202. The reference signal 216 is shifted up or down using the offset generator (DAC) 218, which operates to nullify the offset between the main peak detector 202 and the replica peak detector 210. The offset adjusted reference signal 220 is again shifted using the threshold generator (DAC) 222 to generate a temperature compensated threshold 226. The amount of voltage shift determines the RF amplitude at which to trigger the peak detector.

RF Peak Detector

Figure 3:
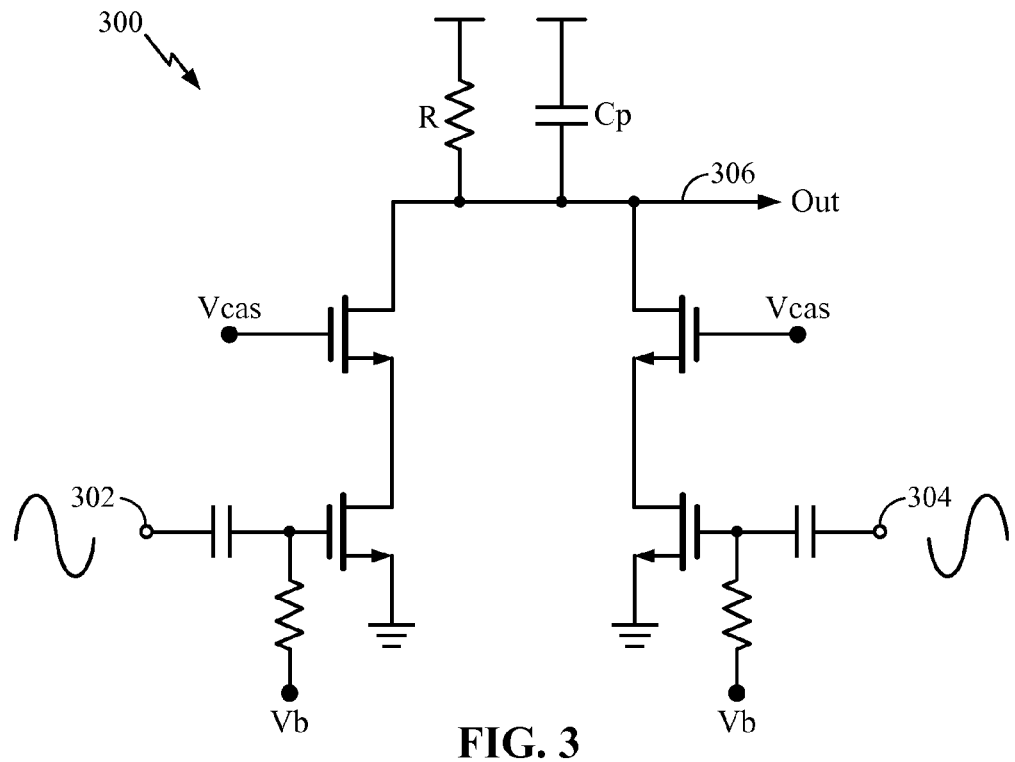
FIG. 3 shows an exemplary embodiment of an RF peak detector.

FIG. 3 shows an exemplary embodiment of an RF peak detector 300. For example, the RF peak detector 300 is suitable for use as the RF peak detector 202 and the replica RF peak detector 210 shown in FIG. 2.

In an exemplary embodiment, the RF peak detector 300 comprises switching devices (for example, four FET transistor) configured to receive RF signals at input terminals 302 and 304. The RF peak detector 300 operates to detect the amplitude of the RF input signals and generates a detection signal 306 that represents the amplitude of the RF inputs. For example, as the amplitude of the RF signals at the input terminals 302 and 304 increases, the amplitude of the detection signal 306 also increases.

In an exemplary embodiment, the RF peak detector 300 is formed on an integrated circuit and exhibits various process variations. In an exemplary embodiment, the RF peak detector 300 is suitable for use for both the RF peak detector 202 and the replica RF peak detector 210, which are formed on the integrated circuit 212. Since both RF peak detectors are formed on the same integrated circuit, they exhibit the same (or approximately equal) process variations, and therefore will provide virtually identical performance. It should also be noted that the exemplary embodiments disclosed herein are not limited to using the peak detector 300 and that other peak detector configurations are possible.

Offset Generator

Figure 4:
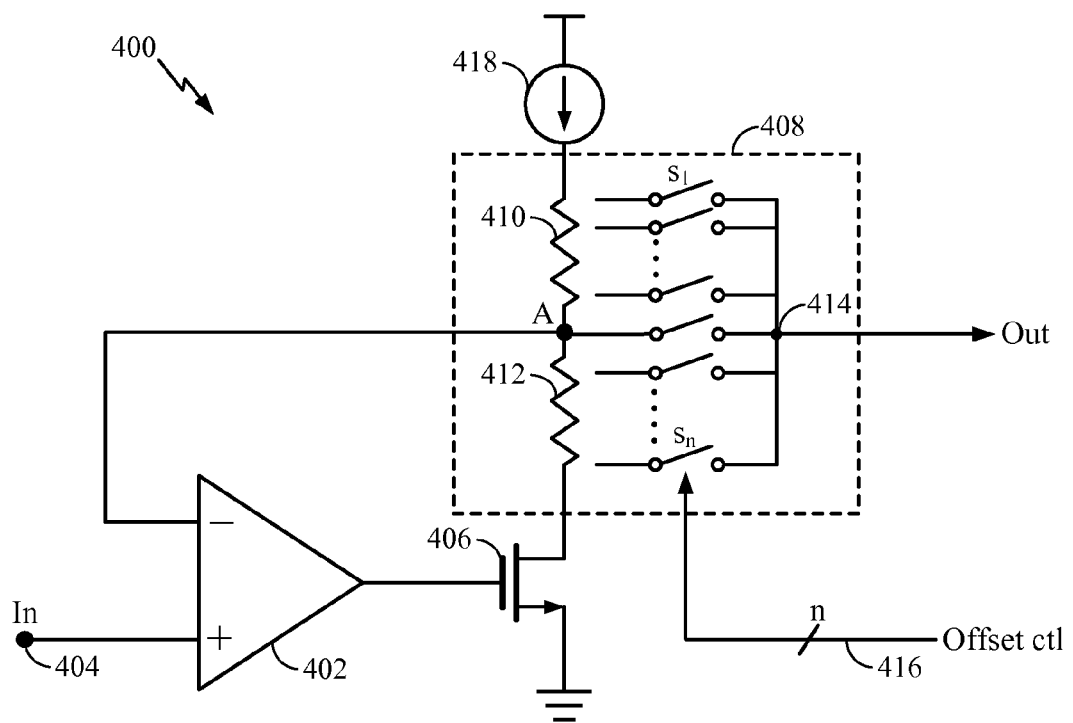
FIG. 4 shows an exemplary embodiment of an offset generator.

FIG. 4 shows an exemplary embodiment of an offset generator 400. For example, the offset generator 400 is suitable for use as the offset generator 218 shown in FIG. 2.

In an exemplary embodiment, the offset generator 400 comprises an amplifier 402 that receives an input signal at an input terminal 404. For example, the input signal may be the reference signal 216 shown in FIG. 2. An output of the amplifier 402 is connected to a gate terminal of a transistor 406. The transistor 406 has a source terminal connected to a ground signal and a drain terminal connected to a resistor ladder 408.

In an exemplary embodiment, the resistor ladder 408 comprises resistor 410 connected to resistor 412 at node A. Each resistor has multiple taps connected to corresponding switches ($s_1$-$s_N$). The outputs of the switches are tied together at an offset output terminal 414. The resistor ladder 408 receives a digital offset control signal 416 comprises n bits that operates to close a switch to enable a particular tap of the resistor ladder 408 to be connected to the offset output terminal 414. Depending on the switch that is closed, the corresponding tap is coupled to the output terminal 414 to provide an offset adjusted signal.

A current source 418 is connected between a supply voltage and the resistor ladder 408. The node A also is connected to an inverting input of the amplifier 402. During operation, the voltage at the input terminal 404 is also generated at node A. The transistor 406 is turned on and the current source 418 sources current through the resistors 410 and 412. The selected tap of the resistor ladder 408 sets the offset voltage that appears at the output terminal 414. It should also be noted that in other exemplary embodiments, offset cancellation can be performed using an offset generator configured with only analog circuitry that operates based on an analog control signal.

Temperature Compensated Threshold Generator

Figure 5:
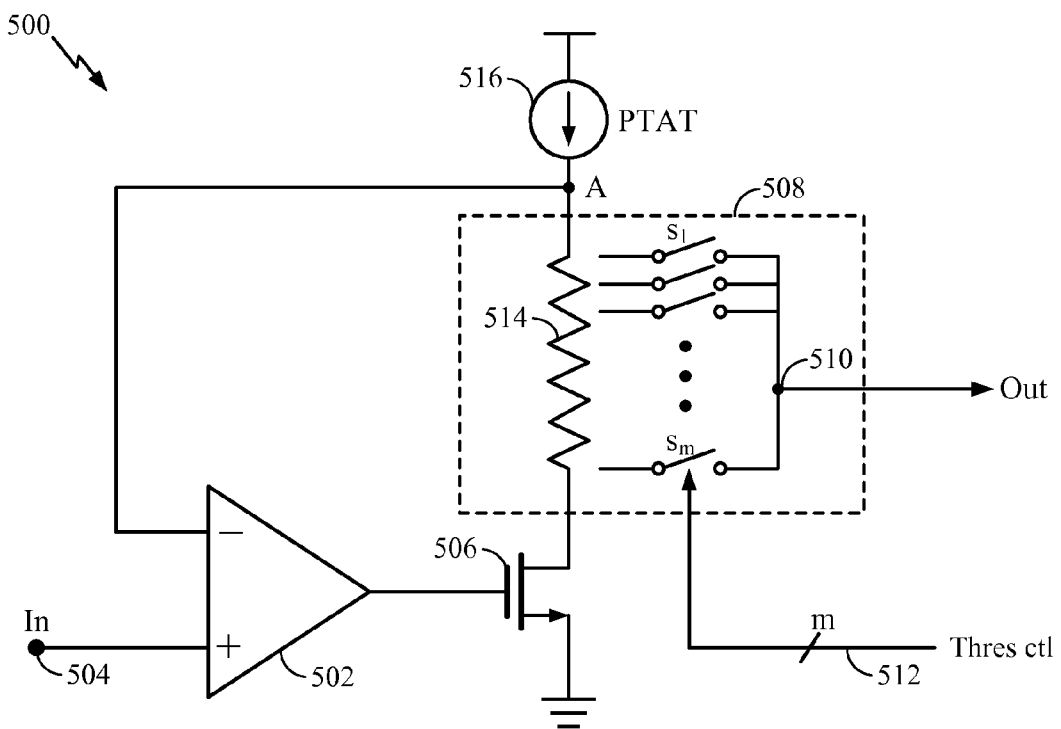
FIG. 5 shows an exemplary embodiment of a temperature compensated threshold generator.

FIG. 5 shows an exemplary embodiment of a temperature compensated threshold generator 500. For example, the threshold generator 500 is suitable for use as the temperature compensated threshold generator 222 shown in FIG. 2.

In an exemplary embodiment, the temperature compensated threshold generator 500 comprises an amplifier 502 that receives an input signal at an input terminal 504. For example, the input signal may be the offset adjusted reference signal 220 shown in FIG. 2. An output of the amplifier 502 is connected to a gate terminal of a transistor 506. The transistor 506 has a source terminal connected to a ground signal and a drain terminal connected to a resistor ladder 508.

In an exemplary embodiment, the resistor ladder 508 comprises a resistor 514 with multiple taps connected to corresponding switches ($s_1$-$s_m$). The outputs of the switches are tied together at a threshold output terminal 510. The resistor ladder 508 is logarithmically partitioned to provide fixed threshold steps in decibels (dB). The resistor ladder 508 receives a digital threshold control signal 512 comprising m bits that operates to close a particular switch to enable a corresponding tap of the resistor ladder 508 to be connected to the threshold output terminal 510. Depending on the switch that is closed, the corresponding tap is coupled to the output terminal 510 to provide a selected voltage.

A PTAT current source 516 is connected between a supply voltage and the resistor ladder 508 at node A. The node A also is connected to an inverting input of the amplifier 502. During operation, the voltage at the input terminal 504 is also generated at node A. The transistor 506 is turned on and the PTAT current source 516 sources current through the resistor 514. The selected tap of the resistor ladder 508 sets the threshold voltage that appears at the threshold output terminal 510. As temperature changes so does the current from the current source 516 and the voltage across the resistor 514 and hence the output at the threshold output terminal 510 tracks the temperature variation of the gain of the peak detector 202.

As the temperature changes, the current provided by the PTAT current source 516 also changes. The changing current results in a changing voltage at the threshold output terminal 510 that is temperature adjusted. In an exemplary embodiment, the temperature characteristics of the PTAT current source 516 match the temperature characteristics of the RF peak detector 202 so that the temperature compensated output threshold at terminal 510 maintains its relationship to the detection signal 206 that is output from the RF peak detector 202. It should also be noted that in other exemplary embodiments, the PTAT current source 516 comprises an adjustable slope characteristic that can be measured and adjusted to match the temperature characteristics of the RF peak detector 202.

Accordingly, various exemplary embodiments of the temperature compensated peak detector 200 provide one or more of the following features.
1. Use of a replica peak detector 210 to generate a reference signal 216 for comparison with a main peak detector 202.
2. Use of an Offset DAC 218 and a threshold DAC 222 in cascade on a reference signal path.
3. The threshold DAC 222 tracks temperature gain variations of main peak detector 202.
4. Use of a comparator 208 that is not clocked to eliminate spurs on RF circuitry.

Figure 6:
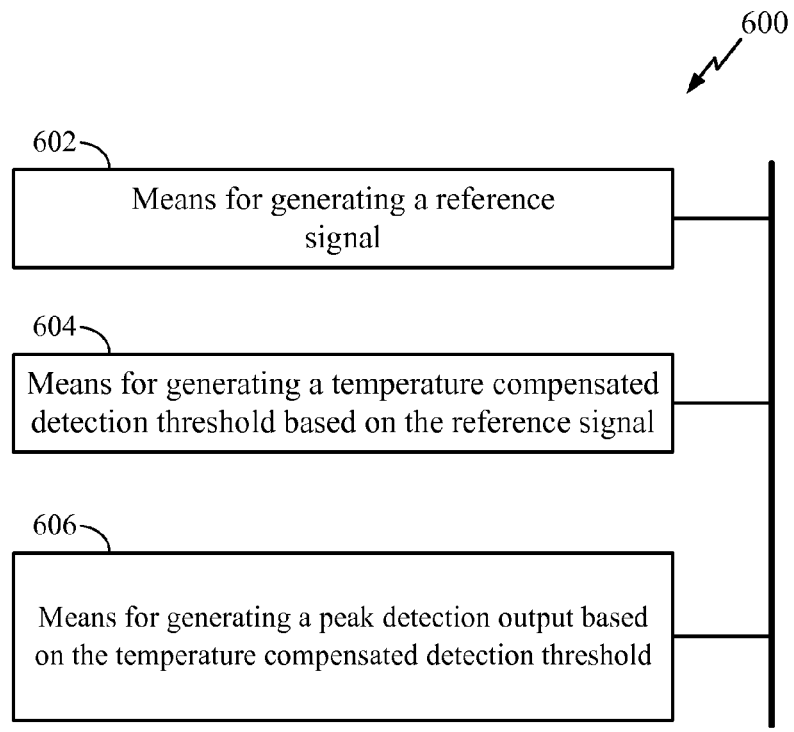
FIG. 6 shows an exemplary embodiment of a temperature compensated RF peak detector apparatus.

FIG. 6 shows an exemplary embodiment of a temperature compensated RF peak detector apparatus 600. For example, the apparatus 600 is suitable for use as the temperature compensated RF peak detector 200 shown in FIG. 2. In an aspect, the apparatus 600 is implemented by one or more modules configured to provide the functions as described herein. For example, in an aspect, each module comprises hardware and/or hardware executing software.

The apparatus 600 comprises a first module comprising means (602) for generating a reference signal, which in an aspect comprises the replica RF peak detector 210.

The apparatus 600 comprises a second module comprising means (604) for generating a temperature compensated detection threshold based on the reference signal, which in an aspect comprises the temperature compensated threshold generator 222.

The apparatus 600 comprises a third module comprising means (606) for generating a peak detection output based on the temperature compensated detection threshold, which in an aspect comprises the comparator 208.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
   a first radio frequency (RF) peak detector configured to generate a reference signal;
   a temperature compensated threshold generator coupled to the first RF peak detector and configured to generate a temperature compensated detection threshold based on the reference signal generated by the first RF peak detector; and
   a comparator configured to generate a peak detection output based on the temperature compensated detection threshold.

2. The apparatus of claim 1, the comparator configured to generate the peak detection output based on a comparison of the temperature compensated detection threshold and a peak detection signal generated by a second RF peak detector.

3. The apparatus of claim 2, further comprising an offset generator configured to receive the reference signal and to generate an offset reference signal based on the reference signal, the offset reference signal provided to the temperature compensated threshold generator.

4. The apparatus of claim 3, the offset generator further configured to generate the offset reference signal to match an offset associated with the second RF peak detector.

5. The apparatus of claim 4, the offset generator comprising a digital to analog converter (DAC) that generates the offset reference signal based on a digital control signal.

6. The apparatus of claim 1, the temperature compensated threshold generator comprising a temperature compensated current source that generates a temperature compensated current.

7. The apparatus of claim 6, the temperature compensated threshold generator further comprising a digital-to-analog converter (DAC) configured to generate the temperature compensated detection threshold based on the temperature compensated current and based on a digital control input.

8. The apparatus of claim 7, wherein the temperature compensated detection threshold and the peak detection output have approximately equal variations with temperature.

9. The apparatus of claim 2, wherein the first RF peak detector and the second RF peak detector are formed on an integrated circuit and are configured to have approximately equal process variations.

10. The apparatus of claim 1, wherein the first RF peak detector is configured to generate the reference signal using an input terminal configured to receive a floating value or configured not to receive an RF signal.

11. The apparatus of claim 1, wherein the peak detection output is provided to a processor configured to detect transmit power in a transmitter based on the peak detection output.

12. The apparatus of claim 1, wherein the peak detection output is provided to a processor configured to detect jamming signal power in a receiver based on the peak detection output.

13. An apparatus comprising:
  means for generating a reference signal;
  means for generating a temperature compensated detection threshold based on the reference signal generated by the means for generating the reference signal, the means for generating the temperature compensated detection threshold coupled to the means for generating the reference signal; and
  means for generating a peak detection output based on the temperature compensated detection threshold.

14. The apparatus of claim 13, the means for generating the peak detection output configured to generate the peak detection output based on a comparison of the temperature compensated detection threshold and a peak detection signal generated by a means for generating a radio frequency (RF) peak detection signal.

15. The apparatus of claim 14, further comprising means for generating an offset reference signal based on the reference signal, wherein the offset reference signal is provided to the means for generating the temperature compensated detection threshold.

16. The apparatus of claim 15, the means for generating the offset reference signal configured to generate the offset reference signal to match an offset associated with the RF peak detection signal.

17. The apparatus of claim 14, the means for generating the temperature compensated detection threshold comprising a digital-to-analog converter (DAC) configured to generate the temperature compensated detection threshold based on a temperature compensated current source and based on a digital control input.

18. The apparatus of claim 17, wherein the temperature compensated detection threshold and the peak detection signal have approximately equal variations with temperature.

19. The apparatus of claim 13, wherein the peak detection output is provided to a processor configured to detect transmit power in a transmitter based on the peak detection output or to detect jamming signal power in a receiver based on the peak detection output.

20. The apparatus of claim 1, wherein the temperature compensated threshold generator is further configured to receive a control signal and to generate the temperature compensated detection threshold based on the reference signal and based on the control signal.

* * * * *